(12) United States Patent
Asao et al.

(10) Patent No.: US 9,949,420 B2
(45) Date of Patent: Apr. 17, 2018

(54) LEAD WIRE CUT-AND-CLINCH APPARATUS

(71) Applicant: FUJI MACHINE MFG. CO., LTD., Chiryu-shi (JP)

(72) Inventors: Kaname Asao, Toyota (JP); Kazuya Degura, Toyota (JP); Yasunari Mizuno, Toyohashi (JP); Toshimi Higashi, Kariya (JP)

(73) Assignee: FUJI MACHINE MFG.CO., LTD., Chiryu-shi (JP)

( * ) Notice: Subject to any disclaimer, the term of this patent is extended or adjusted under 35 U.S.C. 154(b) by 176 days.

(21) Appl. No.: 15/032,108

(22) PCT Filed: Oct. 28, 2013

(86) PCT No.: PCT/JP2013/079099
§ 371 (c)(1),
(2) Date: Apr. 26, 2016

(87) PCT Pub. No.: WO2015/063827
PCT Pub. Date: May 7, 2015

(65) Prior Publication Data
US 2016/0270273 A1 Sep. 15, 2016

(51) Int. Cl.
B23P 19/00 (2006.01)
H05K 13/04 (2006.01)
H05K 13/08 (2006.01)

(52) U.S. Cl.
CPC ......... *H05K 13/0473* (2013.01); *H05K 13/08* (2013.01); *Y10T 29/4913* (2015.01);
(Continued)

(58) Field of Classification Search
CPC ........... Y10T 29/53183; Y10T 29/4914; Y10T 29/49135; Y10T 29/4913; Y10T 29/53174;
(Continued)

(56) References Cited

U.S. PATENT DOCUMENTS 6,477,766 B2 * 11/2002 Imai ................... H05K 13/025
29/564.2
7,568,284 B2 * 8/2009 Kadota ............. H05K 13/0404
29/741
2006/0164794 A1 7/2006 Kadota et al.

FOREIGN PATENT DOCUMENTS

JP 63-289899 A 11/1988
JP 6-61696 A 3/1994
(Continued)

OTHER PUBLICATIONS

International Search Report dated Dec. 10, 2013 in PCT/JP2013/079099 filed Oct. 28, 2013.

*Primary Examiner* — Thiem Phan
(74) *Attorney, Agent, or Firm* — Oblon, McClelland, Maier & Neustadt, L.L.P.

(57) ABSTRACT

Whether or not a lead wire has been normally cut and clinched can be reliably detected. A contact pipe is arranged in lead wire insertion holes of a pair of fixed pawls in a state of being electrically insulated from the fixed pawls. In a case where the lead wire is shorter than a set length after the lead wire is inserted into the lead wire insertion holes, a clearance of the pair of lead wire insertion holes is widened by a set amount in the event of outward bending of the lead wire and is narrowed by a set amount in the event of inward bending. A cut-and-clinch operation is performed with S4 bypassed in a case where the length of the lead wire is at least the set length.

7 Claims, 16 Drawing Sheets

(52) U.S. Cl.
CPC ...... *Y10T 29/4914* (2015.01); *Y10T 29/49139* (2015.01); *Y10T 29/53174* (2015.01)

(58) Field of Classification Search
CPC ......... Y10T 29/53178; Y10T 29/49139; Y10T 29/53065; Y10T 29/53235; H05K 13/0473; H05K 3/306
USPC ....... 29/739, 564.6, 740, 741, 837, 838, 845
See application file for complete search history.

(56) References Cited

FOREIGN PATENT DOCUMENTS

| | | |
|---|---|---|
| JP | 10-224093 A | 8/1998 |
| JP | 2004-200606 A | 7/2004 |

\* cited by examiner

LEAD WIRE CUT-AND-CLINCH APPARATUS

TECHNICAL FIELD

The present disclosure relates to a lead wire cut-and-clinch apparatus (hereinafter, simply referred to as a cut-and-clinch apparatus unless this designation is not particularly necessary) that cuts a lead wire of an electronic circuit component (hereinafter, simply referred to as a component unless this designation is not particularly necessary) which is inserted into a through-hole for lead wire insertion of a circuit board (hereinafter, simply referred to as a board unless this designation is not particularly necessary) and bends the lead wire along a back surface of the board.

BACKGROUND ART

Components mounted on a printed circuit board and constituting an electronic circuit include a lead wire-attached component that has a lead wire. This lead wire-attached component is mounted on the board by being bent along a back surface of the board after the lead wire is inserted into a through-hole formed in the board and the lead wire protruding from the back surface of the board is cut to an appropriate length. PTL 1 discloses an example of a cut-and-clinch apparatus that is used for the component.

CITATION LIST

Patent Literature

PTL 1: JP-A-10-224093

SUMMARY

Problem to be Solved

The cut-and-clinch apparatus that is disclosed in PTL 1 has not only its original function for cutting and bending the lead wire but also a function for stopping an operation of the cut-and-clinch apparatus in the case of an abnormal lead wire insertion and in the case of swarf clogging after detection of whether or not the lead wire has been normally inserted into the insertion hole and whether or not the cut-and-clinch apparatus is clogged with swarf of the lead wire. The present disclosure is to further improve this type of cut-and-clinch apparatus.

Means for Solving Problem

According to the present disclosure, there is provided a lead wire cut-and-clinch apparatus including (a) a pair of fixed pawls including first blades on respective tip surfaces, (b) a pair of movable pawls capable of moving along the respective tip surfaces of the fixed pawls and including respective second blades shearing the lead wire in conjunction with the respective first blades, (c) a pawl set clearance changing device changing a clearance of two sets of pawl sets each having the fixed pawl and the movable pawl, (d) a movable pawl driving device causing the first blades and the second blades to shear and bend the lead wire by relatively moving the movable pawls with respect to the fixed pawls in the two respective sets of pawl sets, (e) respective contact members fixed, in a state of being electrically insulated from the respective fixed pawls by electrical insulating layers, to parts of the respective fixed pawls distanced to opposite side from the respective movable pawls with respect to the respective tip surfaces, (f) an advance pawl set clearance control section allowing the respective contact members and the respective lead wires to approach each other by causing the pawl set clearance changing device to change the pawl set clearance by a set distance after insertion of the lead wires between the respective first blades and second blades and before a movement of the movable pawls by the movable pawl driving device in a state where a position of the pawl set is at a set position, and (g) a pair of detecting circuits formed between the respective contact members and fixed pawls, usually remaining in an open state, and being put into a closed state by the respective contact members and fixed pawls being electrically connected across the insulating layers by the respective lead wires inserted between the respective first blades and second blades.

In a desirable aspect of the present disclosure, the fixed pawl has a lead wire insertion hole into which the lead wire is inserted, the first blade is formed by a line of intersection of the lead wire insertion hole and the tip surface, the movable pawl has a guide hole guiding the lead wire into the lead wire insertion hole, and the second blade is formed on an open fringe of the guide hole on the fixed pawl side.

Effects

In the cut-and-clinch apparatus according to the present disclosure, the pawl set clearance is changed by the set distance by the control of the pawl set clearance changing device by the advance pawl set clearance control section after the insertion of the lead wires between the first blades and the second blades and before the movement of the movable pawls by the movable pawl driving device in the state where the position of the pair of pawl sets is at the set position. As a result, if the respective lead wires are normally inserted between the respective first blades and second blades, the respective contact members and the respective lead wires approach each other, the respective contact members and the respective fixed pawls are conducted across the electrical insulating layers by the respective lead wires or the cut-and-clinch is performed next to the pawl set clearance change, and thus the respective contact members and the respective fixed pawls are conducted with each other. The normal insertion of the respective lead wires is detected by this conduction being detected by the respective detecting circuits. In a case where the clearance change by the pawl set clearance changing device is not performed, the normal insertion is detected by the execution of the cut-and-clinch even in a state where the normal lead wire insertion is not detected.

According to the cut-and-clinch apparatus of the desirable aspect in which the fixed pawl is provided with the lead wire insertion hole and the movable pawl is provided with the guide hole, the effect of the present disclosure described above can be achieved during both the outward bending and the inward bending of the lead wire.

DESCRIPTION OF EMBODIMENTS

Hereinafter, examples according to an embodiment of the present disclosure will be described with reference to accompanying drawings. The present disclosure can take various modified or improved forms, without being limited to the following examples, based on knowledge of those skilled in the art.

Figure 1:
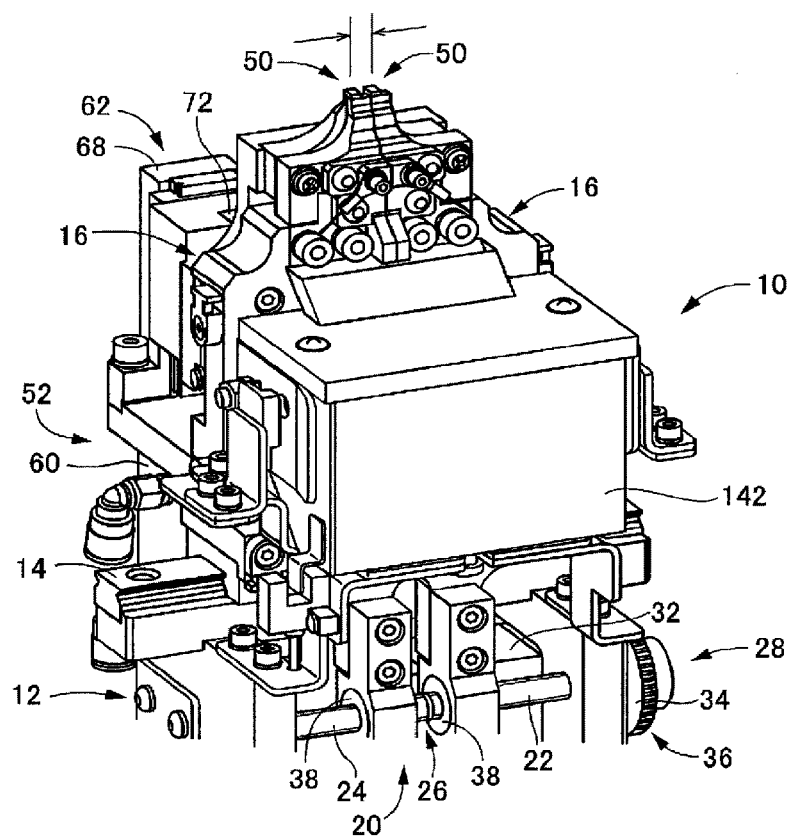
FIG. 1 is a perspective view illustrating a cut-and-clinch apparatus, which is an example of the present disclosure, in a state where a pawl set clearance is at its minimum.
Figure 2:
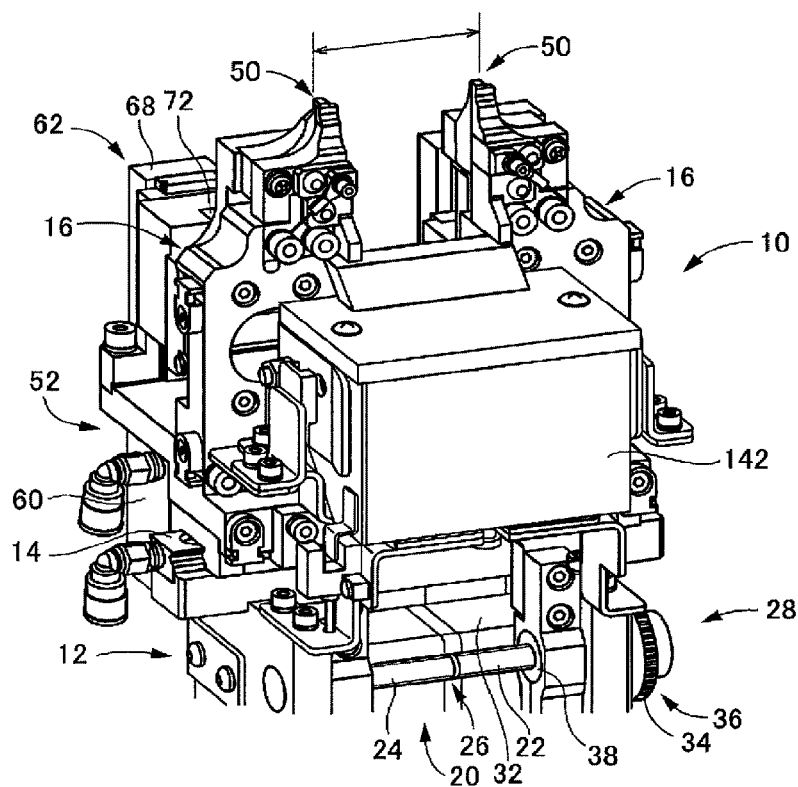
FIG. 2 is a perspective view illustrating the cut-and-clinch apparatus illustrated in FIG. 1 in a state where the pawl set clearance is at its maximum.
Figure 3:
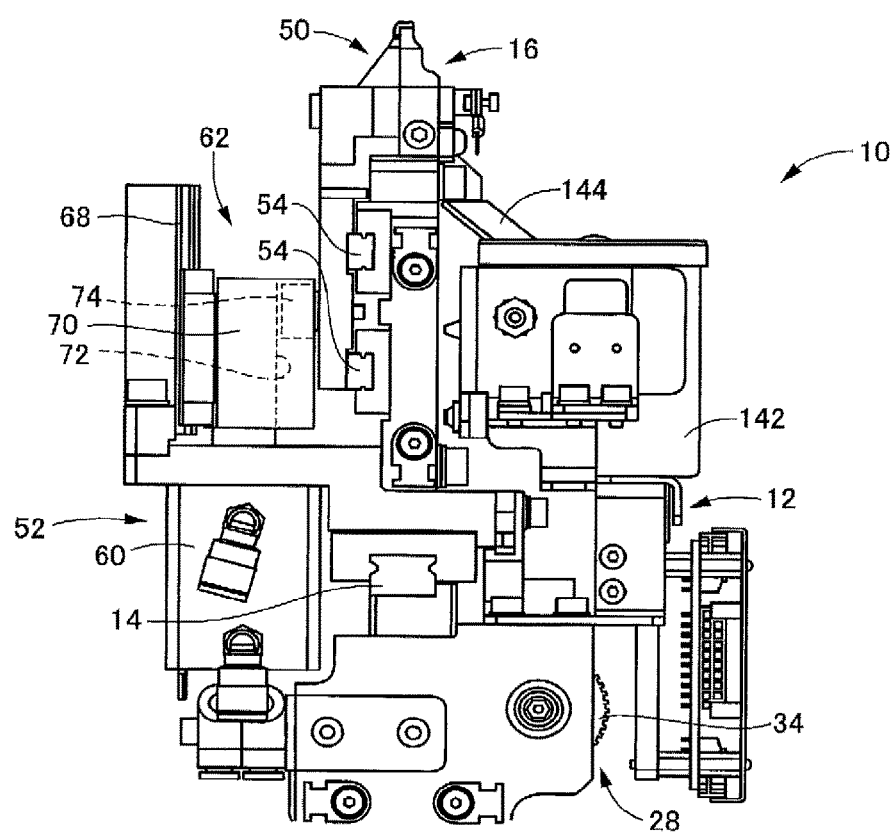
FIG. 3 is a side view of the cut-and-clinch apparatus.

FIGS. 1 to 3 show an example of a cut-and-clinch apparatus. This cut-and-clinch apparatus 10 is disposed as an element constituting an electronic-circuit-component mounting machine including a board conveying and holding device that conveys a board in a horizontal posture and fixes and holds the board at a position determined in advance, a component supply device that supplies a component, and a mounting device that receives the component from the component supply device and mounts the component onto the board held by the board conveying and holding device. The mounting device is provided with a mounting head that is provided with, as a component holding tool, a holding pawl which pinches and holds a main body section or a lead wire portion of the component by using a pair of pawls or a suction nozzle which sucks and holds the main body section of the component by using a negative pressure, a head moving device that allows the mounting head to move in respective directions parallel to an X axis and a Y axis, which are orthogonal to each other on a horizontal plane, and a vertical Z axis, and a head rotating device that allows the mounting head to rotate about a vertical axis. The cut-and-clinch apparatus is an apparatus that cuts a lead wire of the component inserted into a through-hole of the board to a predetermined length and bends the lead wire along a back surface of the board so that the component is temporarily placed on the board. This cut-and-clinch apparatus 10 is moved in the directions parallel to the X axis, the Y axis, and the Z axis and rotated about the vertical axis by a cut-and-clinch apparatus moving and rotating device as well. All the apparatus and devices described above are widely known, and thus only the cut-and-clinch apparatus 10 itself will be described in detail below with illustration and description thereof being omitted.

The cut-and-clinch apparatus 10 is provided with an apparatus main body 12. A linear fixed pawl guide 14 is horizontally disposed in the apparatus main body 12. The fixed pawl guide 14 supports a pair of fixed pawls 16 so that the fixed pawls 16 can approach and be separated from each other. The apparatus main body 12, the fixed pawls 16, and movable pawls 50 (described later) are integral members in which a plurality of members are fixed with bolts or the like for processing and assembly convenience, partial exchange in the event of friction, and the like. In the following description, however, these members will be described as integrated members because these are not directly related to the present disclosure.

Positions of the pair of fixed pawls 16 are changed by a clearance changing device 20, and a clearance of these fixed pawls 16 can be changed between a minimum state that is illustrated in FIG. 1 and a maximum state that is illustrated in FIG. 2. The clearance changing device 20 is provided with a male screw member 26, in which a right threaded portion 22 and a left threaded portion 24 are coaxially provided, and a male screw member rotating and driving device 28. The male screw member rotating and driving device 28 is provided with a servo motor 32 as a driving source and a rotation transmission mechanism 36 including a gear 34, and can rotate the male screw member 26 by any angle based on control of the servo motor 32 by a servo motor control section 152 of a cut-and-clinch apparatus control section 150 illustrated in FIG. 12. In addition, the clearance changing device 20 is screwed with each of the right threaded portion 22 and the left threaded portion 24, is provided with nuts 38 fixed to the respective fixed pawls 16, and can arbitrarily adjust the clearance of the pair of fixed pawls 16 based on the control by the servo motor control section 152. The male screw member 26 and the nuts 38 constitute a ball screw mechanism.

The movable pawl 50 and a movable pawl driving device 52 are held by each of the pair of fixed pawls 16 and can move along with each fixed pawl 16. As most clearly illustrated in FIG. 3, the movable pawls 50 are guided by linear movable pawl guides 54 that are fixed to the respective fixed pawls 16 and can be moved in a direction that is parallel to a direction in which the fixed pawls 16 move. The movable pawl driving device 52 is provided with air cylinders 60, which are held by the respective fixed pawls 16, as driving sources. A vertical operation of these air cylinders 60 is converted to a horizontal motion of the movable pawls 50 by a motion conversion mechanism 62. The motion conversion mechanism 62 is provided with a cam 70 that is guided by linear cam guides 68 which are fixed to the respective fixed pawls 16 in a state of extending in a vertical direction. A cam groove 72, which is inclined with respect to the vertical direction, is formed in the cam 70. A roller 74 as cam follower that is mounted to be capable of rotating about an axis of rotation which is horizontal to the movable pawls 50 is engaged with the cam groove 72. When the cam 70 is lifted and lowered by the air cylinders 60, the pair of movable pawls 50 are moved relative to each other in a horizontal direction and symmetrically to each other.

Figure 4:
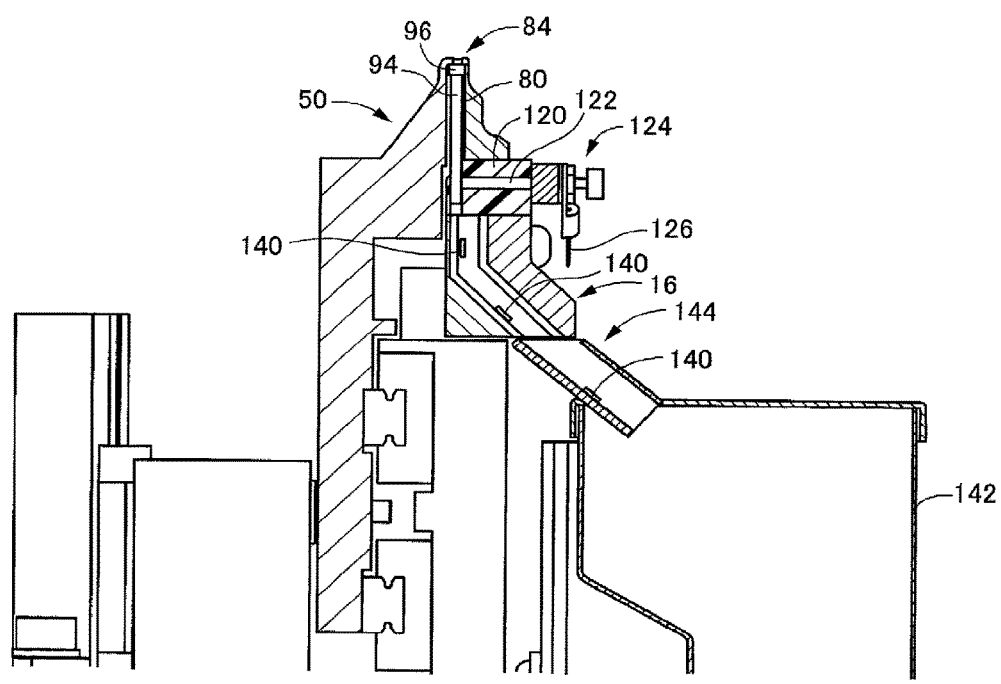
FIG. 4 is a sectional side view illustrating a main section of the cut-and-clinch apparatus.
Figure 5:
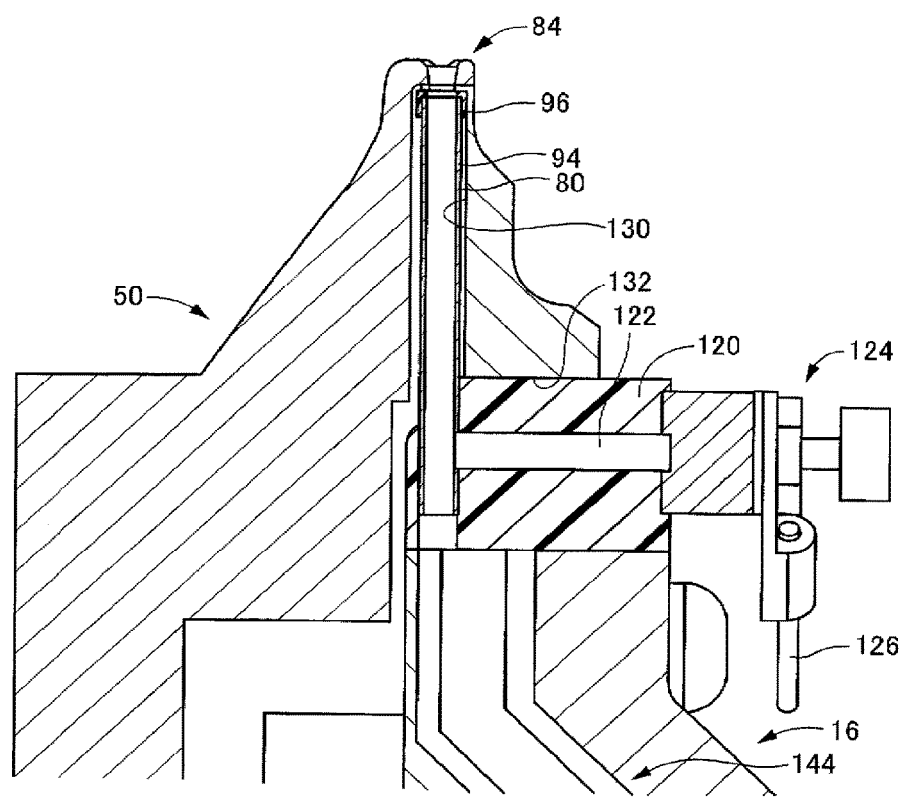
FIG. 5 is a partially enlarged view of FIG. 4.
Figure 6:
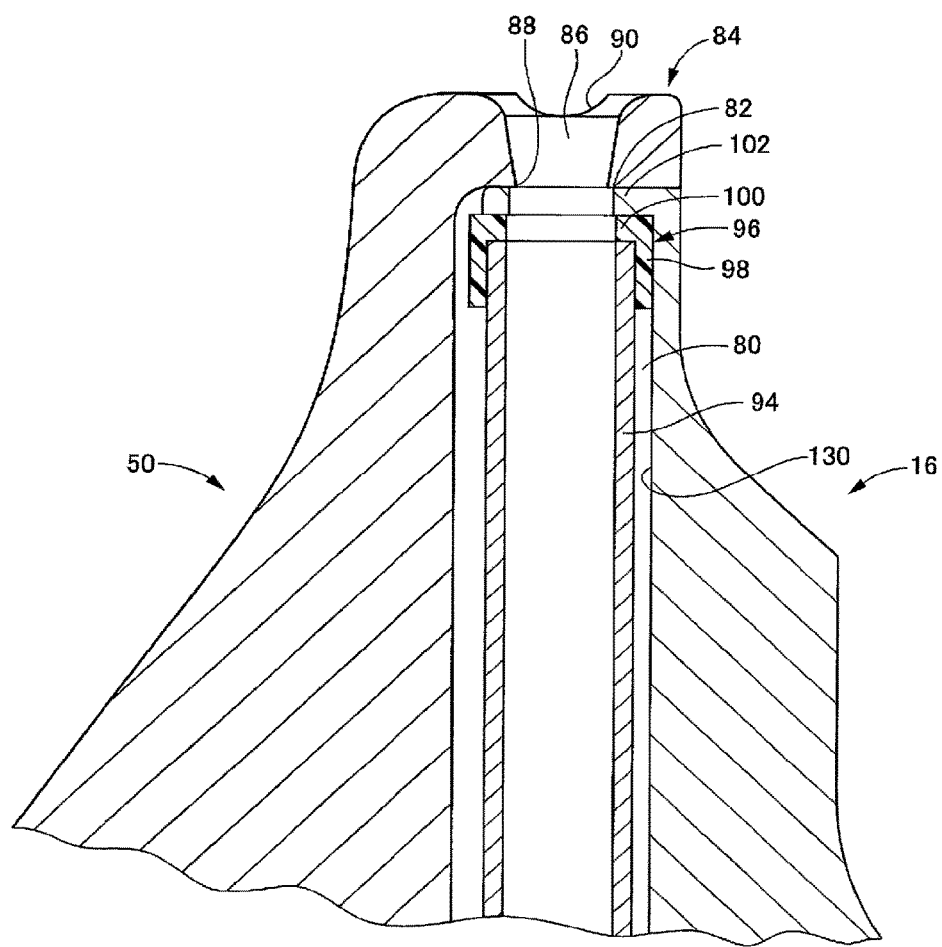
FIG. 6 is a diagram illustrating a part of FIG. 5 in a further enlarged manner.
Figure 7:
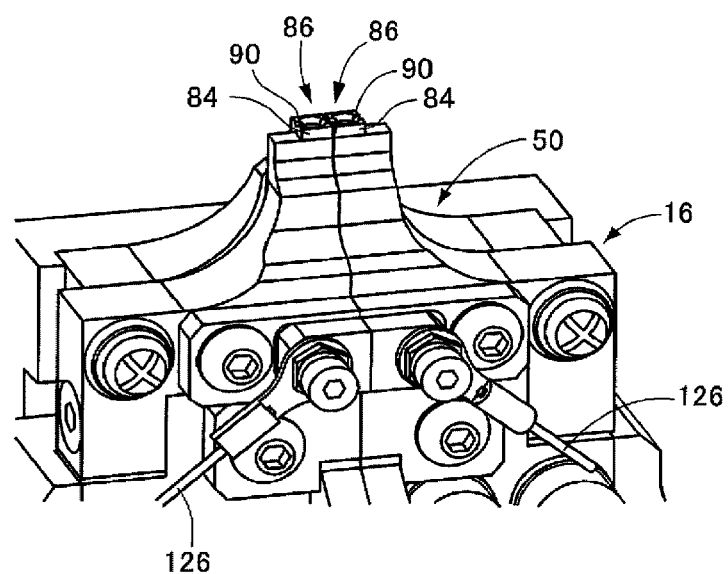
FIG. 7 is an enlarged perspective view of the vicinity of a pawl set of the cut-and-clinch apparatus.

A lead wire insertion hole 80 that extends in the vertical direction is formed in the fixed pawl 16 as illustrated in FIGS. 4 and 5, and a blade 82 is formed along a line of intersection of the lead wire insertion hole 80 and an upper end surface as illustrated in FIG. 6. Although the movable pawl 50 extends in the vertical direction substantially along the fixed pawl 16, an upper end portion is bent at a right angle to become a blade-formed portion 84, and a lower surface of the blade-formed portion 84 is close to the upper end surface of the fixed pawl 16. As most clearly illustrated in FIG. 6, a lead wire guide hole (hereinafter, simply referred to as a guide hole) 86 is formed in the blade-formed portion 84 and a blade 88 is formed along a line of intersection of a lower end portion of an inner peripheral surface thereof and the lower surface of the blade-formed portion 84. The guide hole 86 has a diameter gradually increasing from an end on a side where the blade 88 is formed toward an end on the opposite side so that the inner peripheral surface is a tapered inner peripheral surface. Eventually, the diameter increases in an accelerating manner, and a corner that is formed by the inner peripheral surface of the guide hole 86 and an upper surface of the blade-formed portion 84 is rounded. In addition, a release groove 90 is formed in the upper surface of the blade-formed portion 84, and the release groove 90 allows passage of the lead wire that is cut to a predetermined length during cut-and-clinch execution.

Figure 9:
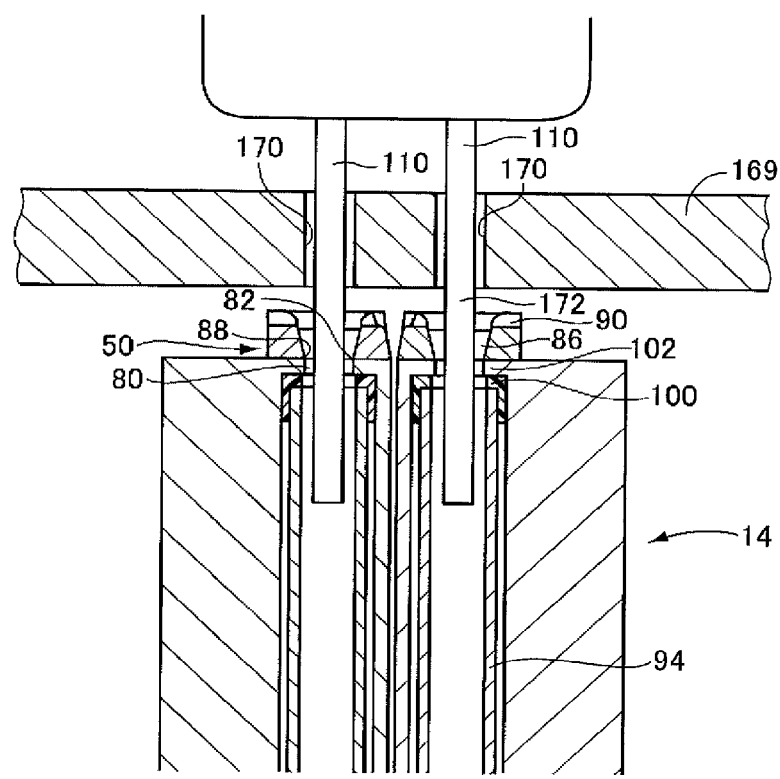
FIG. 9 is a sectional front view of the state that is illustrated in FIG. 8.

A contact pipe 94 as a contact member is arranged in the lead wire insertion hole 80. An upper portion of the contact pipe 94 is electrically insulated with respect to the fixed pawl 16 by an insulating layer 96, and the other part of the contact pipe 94 is electrically insulated with respect to the fixed pawl 16 by an insulating tape (not illustrated). Specifically, the insulating layer 96 is provided with a cylindrical portion 98 and a flange portion 100, the cylindrical portion 98 is interposed between an outer peripheral surface of the contact pipe 94 and an inner peripheral surface of the lead wire insertion hole 80, and the flange portion 100 is interposed between an upper end surface of the contact pipe 94 and a flange portion 102 which is disposed in an opening portion of the lead wire insertion hole 80 as illustrated in FIG. 6. An internal diameter of the flange portion 100 is slightly larger than an internal diameter of the flange portion 102, and thus the flange portion 100 does not interfere with a contact between the flange portion 102 and a lead wire 110 in a case where the lead wire 110 is inserted as illustrated in FIG. 9. This configuration is also effective in preventing damage to or friction of the flange portion 100 attributable to a contact with the lead wire 110. In addition, an internal diameter of the contact pipe 94 is slightly larger than the internal diameter of the flange portion 102, and thus a lower edge of the lead wire 110 is not engaged with an upper edge of the contact pipe 94 when the lead wire 110 is inserted.

As described above, the contact pipe 94 and the fixed pawl 16 are electrically insulated from each other. As illustrated in FIGS. 4 and 5, however, a connecting pin 122 disposed in a state of being electrically insulated from the fixed pawl 16 by an insulating member 120 formed of a synthetic resin is in contact with the contact pipe 94, and a lead wire 126 is connected to the connecting pin 122 by a connector 124.

Figure 8:
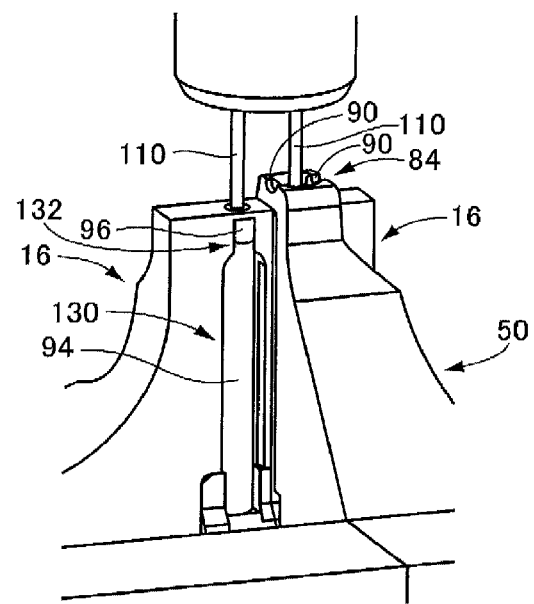
FIG. 8 is a perspective view illustrating a state where a lead wire is inserted into the pawl set with a part of a movable pawl 50 being removed.

The lead wire insertion hole 80 should be referred to as a "hole" in terms of its function. In practice, however, for the convenience of assembling of the contact pipe 94 and the insulating layer 96 into the fixed pawl 16, a groove 130 is formed in a surface of the fixed pawl 16 on a side facing the movable pawl 50 as illustrated in FIG. 8, then, the contact pipe 94, the insulating layer 96, the insulating member 120, and the connecting pin 122 are integrally assembled outside, and thereafter the contact pipe 94 is accommodated in and fixed to the groove 130 while the insulating layer 96 is fitted into and positioned in a positioning groove portion 132 accurately formed in the fixed pawl 16. Accordingly, strictly speaking, the lead wire insertion hole is formed by an inner peripheral surface of the contact pipe 94.

As illustrated in FIG. 4, a container 142 that accommodates a lead wire piece 140 which is cut from the lead wire 110 through a cut-and-clinch operation is disposed in the apparatus main body 12. The container 142 is linked to a lower end opening of the lead wire insertion hole 80 (that is, the contact pipe 94) by a guide passage 144.

Figure 12:
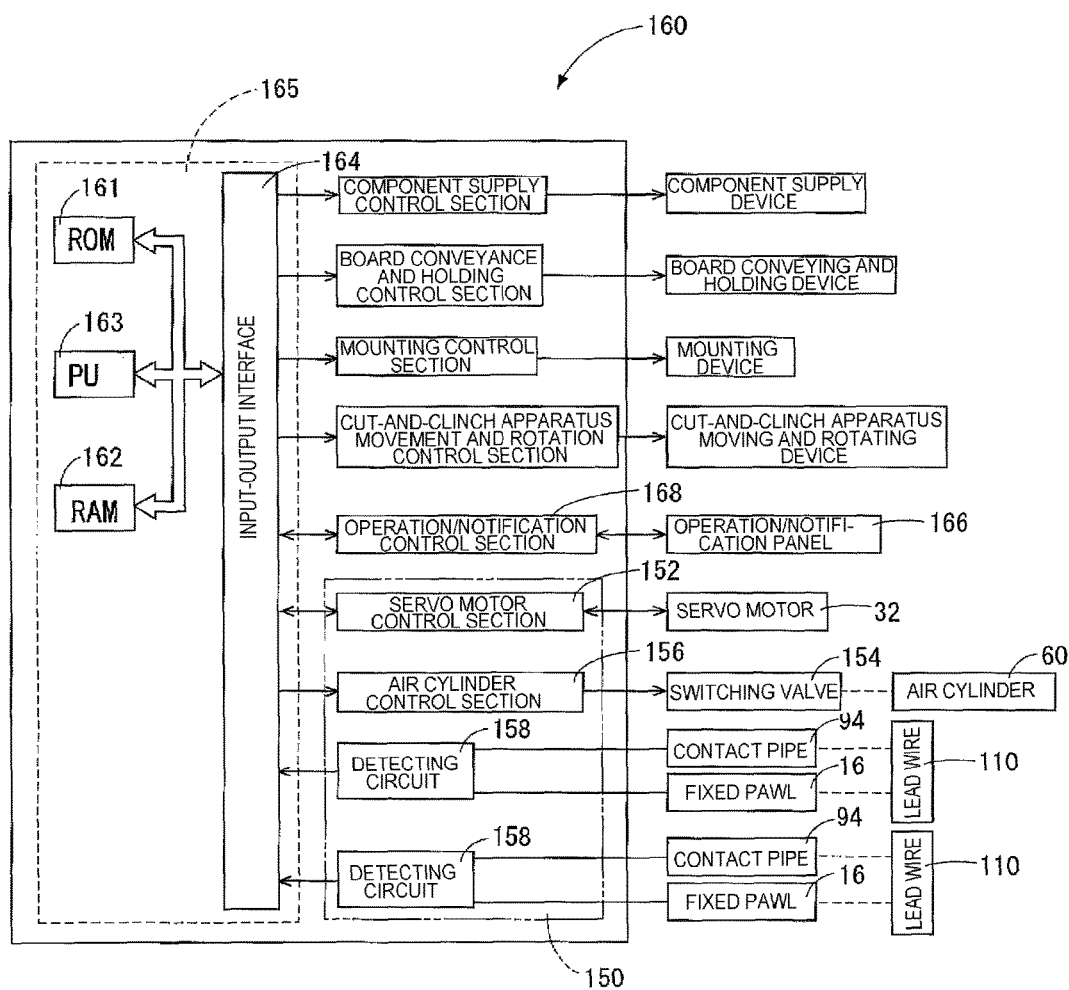
FIG. 12 is a block diagram illustrating a control device for the cut-and-clinch apparatus.

The cut-and-clinch apparatus control section 150 that is a control section for the above-described cut-and-clinch apparatus 10 forms a part of a control device 160 illustrated in FIG. 12. The control device 160 controls the entire electronic-circuit-component mounting machine, and is provided with a cut-and-clinch apparatus movement and rotation control section that controls the cut-and-clinch apparatus moving and rotating device in addition to a component supply control section, a board conveyance and holding control section, and a mounting control section that control the component supply device, the board conveying and holding device, and the mounting device, respectively. Detailed description thereof will be omitted herein.

The cut-and-clinch apparatus control section 150 includes not only the above-described servo motor control section 152 but also an air cylinder control section 156 that controls the air cylinder 60 via a switching valve 154 and two detecting circuits 158 that detect conduction between the contact pipe 94 and the fixed pawl 16 and are disposed in correlation with two respective sets of pawl sets each having one fixed pawl 16 and one movable pawl 50.

Figure 13:
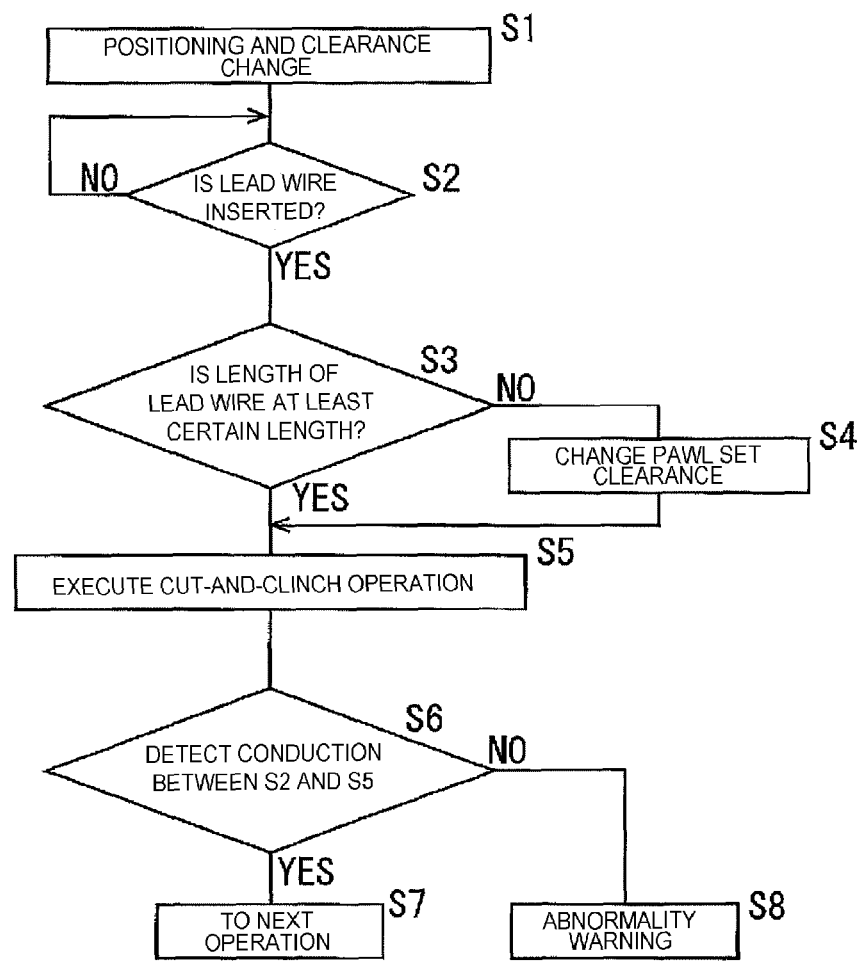
FIG. 13 is a flowchart illustrating a cut-and-clinch routine of the control device.

The control device 160 is provided with a computer 165 that includes a ROM 161, a RAM 162, a PU 163, and an input-output interface 164, an operation-notification panel 166 that includes an operation section which performs an operation for inputting a command to each section of the electronic-circuit-component mounting machine, a display section which displays information relating to each section, and a speaker, and an operation/notification control section 168 that is a control unit for the operation-notification panel 166. Basically, the control device 160 automatically controls the electronic-circuit-component mounting machine by executing various programs that are stored in the ROM 161. A cut-and-clinch routine, which is a part of the programs that is related to the cut-and-clinch apparatus 10, is illustrated in FIG. 13. This routine is executed as a part of a control program for the electronic-circuit-component mounting machine.

Figure 10:
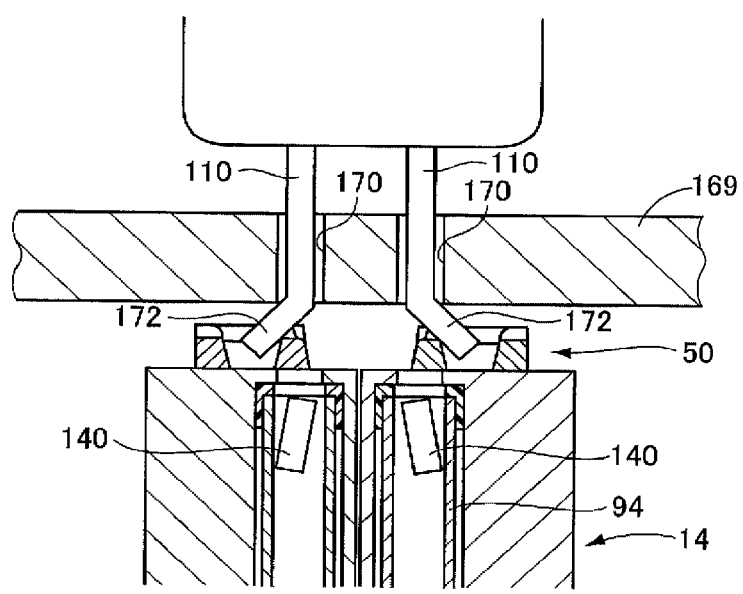
FIG. 10 is a sectional front view illustrating a state where a cut-and-clinch operation is performed in the state that is illustrated in FIG. 9.
Figure 11:
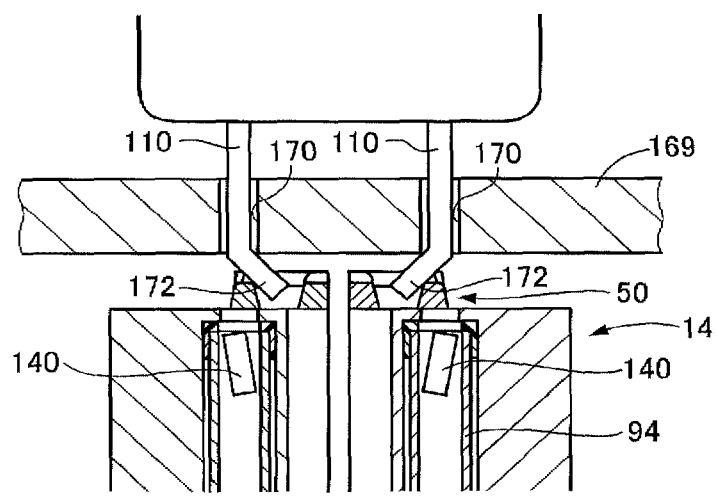
FIG. 11 is a sectional front view illustrating a state where another cut-and-clinch operation is performed.

In a state where the board is positioned and held by the board conveying and holding device, positioning and clearance change according to S1 are executed in conjunction with reception and movement of the next component to be mounted from the component supply device and by the mounting device. The component is not limited in type and may be an axial component, a radial component, or the like. Herein, however, the main body section of the component is held by the component holding tool, the component is moved to above a printed circuit board 169 with a posture of a pair of the lead wires 110 extending in parallel to each other and vertically with a set pitch, and the component is positioned with respect to through-holes 170 of the printed circuit board 169. During the execution of S1, center lines of the guide hole 86 and the lead wire insertion hole 80 of the pawl set as a set of the pair of fixed pawl 16 and the movable pawl 50 is allowed to correspond to a center line of the lead wires 110 which have the above-described set pitch. In S2, after the execution of S1, the control device 160 waits for the insertion of the lead wires 110 into the through-holes 170 and the pawl set as illustrated in FIG. 9. In S3, after the insertion is completed, it is determined whether or not the length of the lead wire 110 of the component is at least a set length based on lead wire length data set in advance. If the determination result is NO, a pawl set clearance change is performed in S4. In other words, in a case where the cut-and-clinch operation is an operation through which protruding portions 172 of the pair of lead wires 110 below the through-holes 170 are bent in directions away from each other (hereinafter, referred to as outward) as illustrated in FIG. 10 (hereinafter, referred to as outward bending), the clearance of the two sets of pawl sets (clearance of the center lines of the guide hole 86 and the lead wire insertion hole 80 of the two sets of pawl sets) is widened by a set amount. In a case where the cut-and-clinch operation is an operation through which the protruding portions 172 of the pair of lead wires 110 below the through-holes 170 are bent in directions approaching each other as illustrated in FIG. 11 (hereinafter, referred to as inward bending), the clearance of the two sets of pawl sets is narrowed by a set amount.

Figure 14:
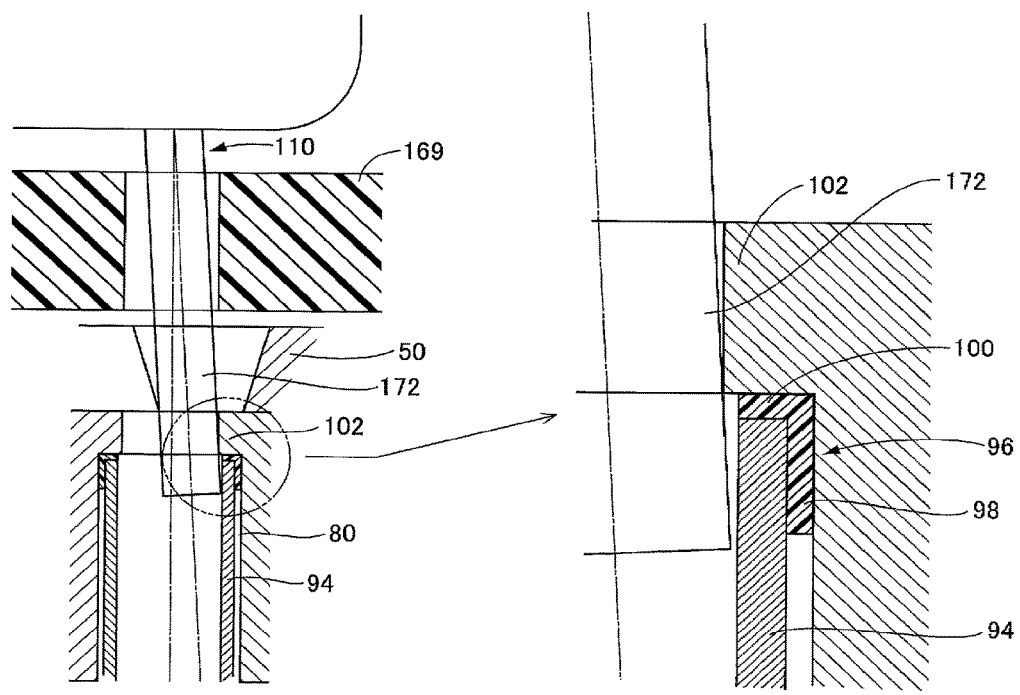
FIG. 14 is a diagram for showing the necessity of a pawl set clearance change prior to execution of the cut-and-clinch that is illustrated in FIG. 10.
Figure 15:
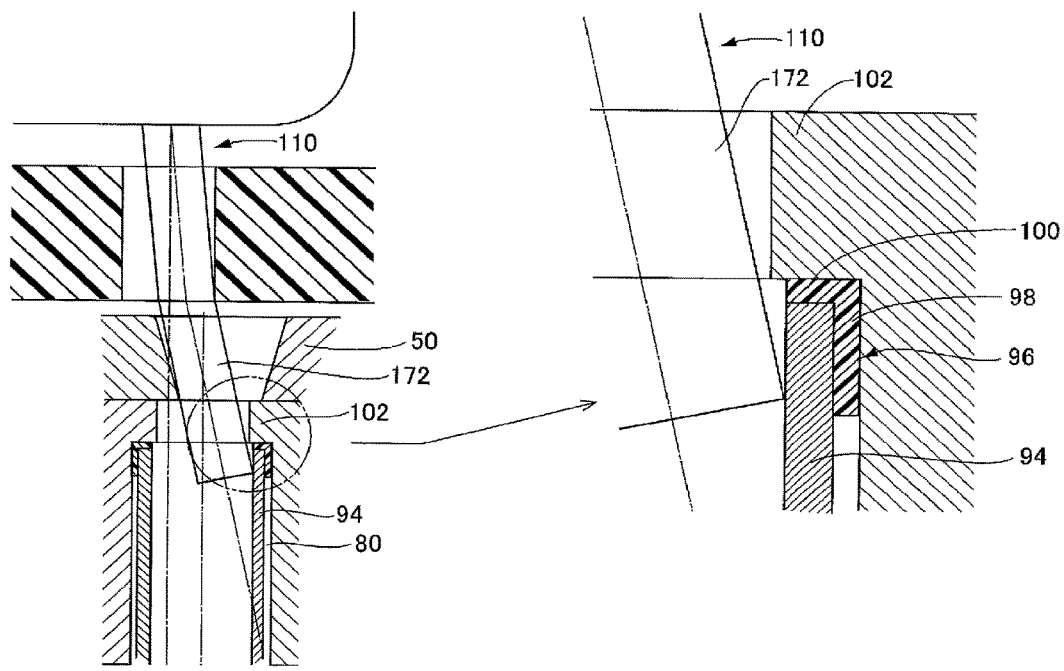
FIG. 15 is a diagram for showing conduction between a fixed pawl 16 and a contact pipe 94 by a lead wire 110 during the execution of the cut-and-clinch that is illustrated in FIG. 10.

A reason for this will be described with reference to FIGS. 14 and 15 and with the case of outward bending used as an example. In a case where the cut-and-clinch operation is performed without the pawl set clearance change being performed and with the lead wire 110 being shorter than the set length, an intermediate portion of the lead wire 110 comes into contact with the flange portion 102 before a tip of the lead wire 110 comes into contact with the inner peripheral surface of the contact pipe 94 as illustrated in FIG. 14 and the conduction between the fixed pawl 16 and the contact pipe 94 by the lead wire 110 is impeded. Then, a tip portion of the lead wire 110 is not moved outward despite a further outward movement of the movable pawl 50 and only escapes from the lead wire insertion hole 80 while maintaining its contact with the flange portion 102. As a result, the tip portion of the lead wire 110 tends to be bent inward by the movable pawl 50 and the flange portion 102, and the tip of the lead wire 110 rather recedes from the inner peripheral surface of the contact pipe 94 not to be in contact with the contact pipe 94.

In a case where the cut-and-clinch operation is performed after the pawl set clearance is widened by at least a set distance in advance, an inclination angle of the tip portion of the lead wire 110 with respect to a vertical line increases. Accordingly, when the cut-and-clinch operation is performed by the movable pawl 50, the intermediate portion of the lead wire 110 comes into contact with the inner peripheral surface of the contact pipe 94 before coming into contact with the flange portion 102 as illustrated in FIG. 15. Then, a further movement of the movable pawl 50 causes the tip portion of the lead wire 110 to tend to be bent inward by the movable pawl 50 and the contact pipe 94, and then the tip portion of the lead wire 110 comes into contact with both the contact pipe 94 and the flange portion 102 and allows the conduction between both. Then, the fact of the conduction is stored by the PU 163 in a conduction detecting memory that is a lead wire insertion detection memory of the RAM 162. Then, the tip of the lead wire 110 moves away from the inner peripheral surface of the contact pipe 94 and the lead wire 110 escapes from the lead wire insertion hole 80 while maintaining its contact with the flange portion 102.

A case where the lead wire 110 is shorter than the set length has been described above. In a case where the lead wire 110 is longer than the set length, the tip of the lead wire 110 comes into contact with the inner peripheral surface of the contact pipe 94 before the intermediate portion of the lead wire 110 comes into contact with the flange portion 102 even in the event of the cut-and-clinch operation with no pawl set clearance widening. Then, the same phenomenon as in the above-described case where the pawl set clearance is widened occurs, and the fixed pawl 16 and the contact pipe 94 are conducted by the lead wire 110 and the fact is stored in the conduction detecting memory of the RAM 162.

For the above-described reason, the cut-and-clinch operation according to S5 is executed after the pawl set clearance change is performed in S4 in a case where the lead wire 110 is shorter than the set length and S5 is executed with S4 bypassed in a case where the length of the lead wire 110 is at least the set length. In any of the cases, it is determined in S6, after the execution of the cut-and-clinch operation, whether or not the fixed pawl 16 and the contact pipe 94 are conducted by the lead wire 110 at any point in time during the execution of S2 to S5 and the fact is stored in the conduction detecting memory. If the determination result is YES, the next operation of the mounting machine such as an operation for mounting the next component is executed in S7. If the determination result is NO, the operation of the mounting machine is stopped based on the non-storage of conduction detection in the conduction detecting memory of the RAM 162 and an abnormality warning is performed by the operation-notification panel 166 in S8. Specifically, a sound-based notification that "the insertion of the lead wire 110 has not been normally performed" and on-screen display of a situation of one of the two sets of pawl sets in which normal insertion of the lead wire 110 has not been detected are performed.

In response to this, an operator performs a required processing for the normal insertion of the lead wire 110. Examples of this processing include maintenance of the cut-and-clinch apparatus 10 and a cut-and-clinch routine change. This cut-and-clinch routine change is a processing that is considered to be effective for the detection of the normal insertion of the lead wire 110, examples of which include determining whether or not "the amount of movement of the contact pipe 94 is allowed to be increased in S3 and the normal insertion of the lead wire 110 is made available based thereon" and operating the operation-notification panel 166 to command the amount of movement of the contact pipe 94 to be increased when the determination of the result is positive.

As is apparent from the above description, in this example, the insertion of the lead wire into the lead wire insertion hole is determined to have been normally performed in a case where the detecting circuit is in a closed state during the execution of any of S2 to S5 of the cut-and-clinch routine, but a first determination section which determines that the lead wire insertion was normally performed before the initiation of the cut-and-clinch operation in S5 and a second determination section which determines that the lead wire insertion into the lead wire insertion hole was not normally performed in a case where the detecting circuit was not put into the closed state until the termination of the execution of S5 can also be disposed.

In the above-described example, the pawl set clearance change according to S4 is executed only in a case where the lead wire is shorter than the set length, and thus an unnecessary pawl set clearance change can be eliminated. Nevertheless, the pawl set clearance change can be performed regardless of the length of the lead wire as well.

Figure 16:
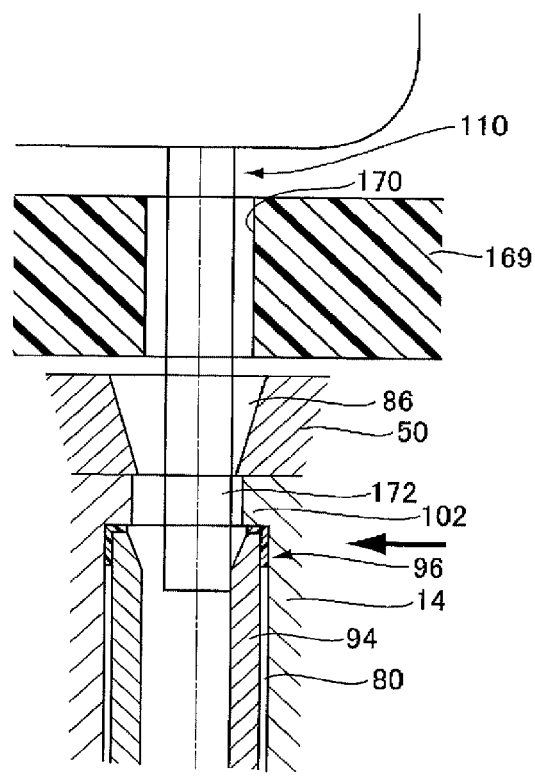
FIG. 16 is a diagram illustrating a process of the conduction between the fixed pawl 16 and the contact pipe 94 by the lead wire 110 resulting from the pawl set clearance change according to another example of the present disclosure.

The internal diameter of the flange portion 102 of the fixed pawl 16 is slightly smaller than the internal diameter of the contact pipe 94. However, as illustrated in FIG. 16, a state where the internal diameter of the contact pipe 94 is smaller is also possible. In this case, the pawl set clearance change prior to the execution of the cut-and-clinch causes the contact pipe 94 to move in the direction that is illustrated by an arrow in FIG. 16 and to come into contact with the protruding portion 172 of the lead wire 110 and then the contact pipe 94 is further moved in the same direction so that a moment when both the contact pipe 94 and the movable pawl 50 come into contact with the lead wire 110 with the protruding portion 172 being bent, that is, a moment when the conduction between the contact pipe 94 and the fixed pawl 16 by the lead wire 110 is detected arises. In this example, however, it is required that a relatively gentle taper is added to an upper end portion of the inner peripheral surface of the contact pipe 94 as illustrated in FIG. 16 and the upper end surface of the contact pipe 94 is completely covered by the flange portion 102 during the insertion of the lead wire 110 into the lead wire insertion hole 80 so that the insertion is not impeded by abutting against an upper end of the contact pipe 94. In addition, the lead wire 110 causes the contact pipe 94 and the fixed pawl 16 to be indirectly conducted via another member allowing the conduction between the movable pawl 50 and the fixed pawl 16 along with the movable pawl 50 instead of causing the contact pipe 94 and the fixed pawl 16 to be directly conducted. Furthermore, in this example, it is desirable, although not essential, that the pawl set is moved in the direction opposite to the direction of the movement of the movable pawl 50 for the cut-and-clinch operation in contrast to the case of the above-described example.

The cut-and-clinch apparatus that allows both the outward bending and inward bending of the lead wire 110 has been described above. However, the cut-and-clinch apparatus can allow only one of the outward bending and the inward bending as well. In this case, the fixed pawl and the movable pawl do not have to have the lead wire insertion hole 80 and the guide hole 86 which surround the entire circumference of the lead wire 110 and may be provided with a first blade and a second blade which are capable of shearing the lead wire 110 in conjunction with each other.

REFERENCE SIGNS LIST

10: cut-and-clinch apparatus, 16: fixed pawl, 20: clearance changing device, 50: movable pawl, 52: movable pawl driving device, 80: lead wire insertion hole, 82: blade, 86: lead wire guide hole (guide hole), 88: blade, 94: contact pipe, 96: insulating layer, 110: lead wire, 150: cut-and-clinch apparatus control section, 158: detecting circuit, 169: circuit board (board), 170: through-hole, 172: protruding portion

The invention claimed is:

1. A lead wire cut-and-clinch apparatus cutting a protruding portion of a lead wire of an electronic-circuit-component inserted into a through-hole of a circuit board and protruding toward a back surface side of the circuit board to a set length and bending the protruding portion along a back surface of the circuit board, comprising:
   a pair of fixed pawls including first blades on respective tip surfaces;
   a pair of movable pawls capable of moving along the respective tip surfaces of the fixed pawls and including respective second blades shearing the lead wire in conjunction with the respective first blades;
   a pawl set clearance changing device changing a clearance of two sets of pawl sets each having the fixed pawl and the movable pawl;
   a movable pawl driving device causing the first blades and the second blades to shear and bend the lead wire by relatively moving the movable pawls with respect to the fixed pawls in the two respective sets of pawl sets;
   respective contact members fixed, in a state of being electrically insulated from the respective fixed pawls by electrical insulating layers, to parts of the respective fixed pawls distanced to opposite side from the respective movable pawls with respect to the respective tip surfaces;
   an advance pawl set clearance control section allowing the respective contact members and the respective lead wires to approach each other by causing the pawl set clearance changing device to change the pawl set clearance by a set distance after insertion of the lead wires between the respective first blades and second blades and before a movement of the movable pawls by the movable pawl driving device in a state where a position of the pawl set is at a set position; and
   a pair of detecting circuits formed between the respective contact members and fixed pawls, usually remaining in an open state, and being put into a closed state by the respective contact members and fixed pawls being electrically connected across the insulating layers by the respective lead wires inserted between the respective first blades and second blades.

2. The lead wire cut-and-clinch apparatus according to claim 1,
   wherein the advance pawl set clearance control section causes the pawl set clearance changing device to perform the pawl set clearance change in a case where the lead wire of the electronic circuit component is shorter than the set length and causes the pawl set clearance changing device not to perform the pawl set clearance change in a case where the length of the lead wire is at least the set length.

3. The lead wire cut-and-clinch apparatus according to claim 1,
   wherein the fixed pawl includes a lead wire insertion hole into which the lead wire is inserted, the first blade is formed by a line of intersection of the lead wire insertion hole and the tip surface, the movable pawl includes a guide hole guiding the lead wire into the lead wire insertion hole, and the second blade is formed on an open fringe of the guide hole on the fixed pawl side.

4. The lead wire cut-and-clinch apparatus according to claim 3,
   wherein an inward first flange portion is formed at a part of the lead wire insertion hole of the fixed pawl adjacent to the tip surface, the electrical insulating layer has (a) a cylindrical portion covering an inner peripheral surface of the lead wire insertion hole and (b) a second flange formed at a part of the cylindrical portion adjacent to the first flange portion and slightly larger in internal diameter than a first flange, and the contact member is a cylindrical contact pipe covering an inner peripheral surface of the cylindrical portion of the electrical insulating layer and larger in internal diameter than the first flange.

5. The lead wire cut-and-clinch apparatus according to claim 3,
   wherein an inward first flange portion is formed at a part of the lead wire insertion hole of the fixed pawl adjacent to the tip surface, the electrical insulating layer has (a) a cylindrical portion covering an inner peripheral surface of the lead wire insertion hole and (b) a second flange formed at a part of the cylindrical portion adjacent to the first flange portion and slightly larger in internal diameter than a first flange, and the contact member is a contact pipe having a substantially cylindrical shape, covering an inner peripheral surface of the cylindrical portion of the electrical insulating layer, and smaller in internal diameter than the first flange, the internal diameter gradually increasing as the contact member approaches the second flange and the internal diameter ultimately becoming larger than the internal diameter of the first flange.

6. The lead wire cut-and-clinch apparatus according to claim 3, further comprising:

a first determination section determining that the lead wire insertion into the lead wire insertion hole has been normally performed in a case where the detecting circuit is in the closed state between initiation of the lead wire insertion into the lead wire insertion hole of the fixed pawl and termination of the pawl set clearance change based on control by the advance pawl set clearance control section.

7. The lead wire cut-and-clinch apparatus according to claim 3, further comprising:

a second determination section determining that the lead wire insertion into the lead wire insertion hole has not been normally performed in a case where the detecting circuit is not in the closed state between the initiation of the lead wire insertion into the lead wire insertion hole of the fixed pawl and the termination of the movement of the movable pawl by the movable pawl driving device.

* * * * *